(12) United States Patent
Chun

(10) Patent No.: US 7,645,679 B2
(45) Date of Patent: Jan. 12, 2010

(54) METHOD FOR FORMING ISOLATION LAYER IN SEMICONDUCTOR DEVICES

(75) Inventor: In Kyu Chun, Gyeonggi-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 407 days.

(21) Appl. No.: 11/612,632

(22) Filed: Dec. 19, 2006

(65) Prior Publication Data
US 2007/0166949 A1    Jul. 19, 2007

(30) Foreign Application Priority Data
Dec. 29, 2005   (KR) .................... 10-2005-0133188

(51) Int. Cl.
*H01L 21/76* (2006.01)
(52) U.S. Cl. ............... 438/435; 438/437; 257/E21.546; 257/E21.549
(58) Field of Classification Search ................ 438/435, 438/437; 257/E21.546, E21.549
See application file for complete search history.

(56) References Cited

U.S. PATENT DOCUMENTS 6,140,208 A * 10/2000 Agahi et al. ................. 438/437
6,331,472 B1 * 12/2001 Liu et al. ..................... 438/424
6,333,242 B1 * 12/2001 Hwang et al. ............... 438/435

FOREIGN PATENT DOCUMENTS

KR   10-1996-0071497   8/1999
KR   10-1998-0019871   12/1999

* cited by examiner

*Primary Examiner*—Lex Malsawma
(74) *Attorney, Agent, or Firm*—Saliwanchik, Lloyd & Saliwanchik

(57) ABSTRACT

A method for forming an isolation layer for a semiconductor device is provided. The preferred method is capable of securing a gap fill margin during formation of an isolation layer. A device isolation layer formed according to a preferred method includes a trench formed in a device separation area of a semiconductor substrate; a thermal oxidation layer formed in a part of the trench; an oxidation silicon layer formed on the thermal oxidation layer; and an oxidation isolation layer formed on the oxidation silicon layer and filling the trench.

3 Claims, 5 Drawing Sheets

METHOD FOR FORMING ISOLATION LAYER IN SEMICONDUCTOR DEVICES

RELATED APPLICATION(S)

This application claims priority under 35 U.S.C. §119(e) of Korean Patent Application No. 10-2005-0133188 filed Dec. 29, 2005, which is incorporated herein by reference in its entirety.

FIELD OF THE INVENTION

The present invention relates to a method for forming isolation layers for semiconductor devices.

BACKGROUND OF THE INVENTION

In general, semiconductor devices include a device isolation area for electrically separating respective circuit patterns and a device formation area for forming respective circuit patterns.

According to the recent high integration of semiconductor devices, methods for reducing a device isolation area and a device formation area are being suggested.

The most common method for forming the device isolation area is STI (Shallow Trench Isolation).

Hereinafter, a method for forming an isolation layer in a semiconductor device according to the related art will be described with reference to the accompanying drawings.

FIGS. 1a through FIG. 1d are cross-sectional views for illustrating a method for forming an isolation layer in accordance with the related art.

Referring to FIG. 1a, an oxide layer 102 and a nitride layer 103 are deposited on a semiconductor substrate 101.

A photosensitive resist is coated on a top surface of the nitride layer 103 and patterned by an exposure and developing process to form a photoresist layer pattern 104 exposing the nitride layer 103 on an isolation region.

Referring to FIG. 1b, a trench 105 having a predetermined depth is formed by performing an etching process using the photoresist layer pattern 104.

The photoresist layer pattern 104 is removed through a cleaning process, and a thermal oxidation layer 106 is formed in the trench 105 by a thermal oxidation process.

Then an isolation bed 107a is formed by performing a gap fill (isolation material) process on the substrate including the thermal oxidation layer 106 in the trench 105.

Material used for forming the isolation layer 107a is a high density plasma oxide.

Referring to FIG. 1c, a planarization process is performed on the surface of the semiconductor substrate 101 until the nitride layer 103 is exposed to form the isolation layer 107 from the isolation bed 107a.

Herein, the semiconductor substrate 101 is planarized through CMP (Chemical Mechanical Polishing) process, and the isolation layer 107 is formed inside of the trench 105.

Referring to FIG. 1d, the oxide layer 102 and the nitride layer 103 are removed by a wet etching and cleaning process.

Accordingly, a device isolation layer is formed in the device isolation area by the isolation material filled in the trench 105.

However, as semiconductors become smaller and highly integrated, the isolation layers become deeper and more narrow.

Therefore, it becomes more and more difficult to completely fill isolation material in a trench that is formed deep and narrow due to the increasingly high level of integration of devices.

Accordingly, the conventional chemical deposition method may not be capable of securing the gap fill margin of isolation material filled in a deep and narrow trench.

BRIEF SUMMARY

Accordingly, it is an object of embodiments of the present invention to provide a method that is capable of securing gap fill margin when forming an isolation layer.

In accordance with an embodiment of the present invention, there is provided an isolation layer for a semiconductor device comprising: a trench of a predetermined depth formed in a device separation area of a semiconductor substrate; a thermal oxidation layer formed in a part of the trench; a silicon rich oxide layer formed on the thermal oxidation layer; and an oxidation isolation layer filled in a part of the trench including the silicon rich oxide layer.

In accordance with another embodiment of the present invention, there is provided a method for forming an isolation layer in a semiconductor device comprising the steps of: sequentially forming an oxide layer and a nitride layer on a semiconductor substrate; forming a photosensitive film pattern for forming a trench on the nitride layer; forming a trench to a predetermined depth in the semiconductor substrate using the photosensitive film pattern as a mask; forming a thermal oxidation layer on the substrate including the trench; removing the thermal oxidation layer that is on the nitride layer and removing the nitride layer, both by a first planarization process; forming a silicon rich oxide layer on the oxide layer and in the trench; forming an oxidation isolation layer on the substrate including the silicon oxide layer by a gap fill process; removing the isolation layer to expose the silicon rich oxide layer by a second planarization process; and removing the oxidation isolation layer and the silicon rich oxide layer by a wet etching process It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

DETAILED DESCRIPTION OF PREFERRED EMBODIMENTS

Figure 1A:
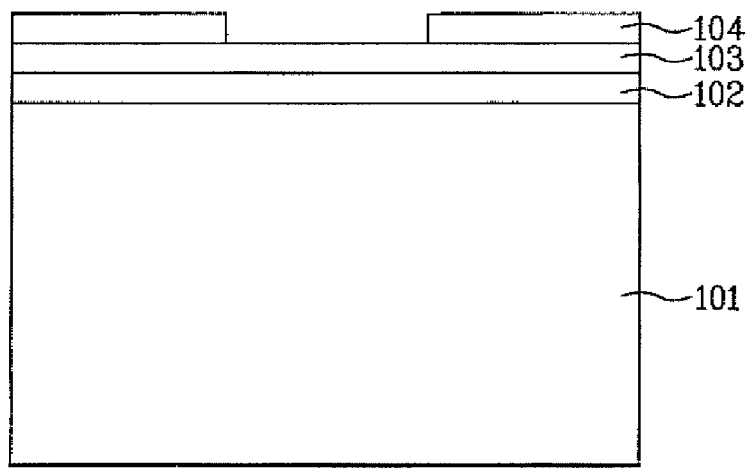
FIGS. 1a to 1d are cross-sectional views showing a related art method for forming an isolation layer for a semiconductor device.
Figure 1B:
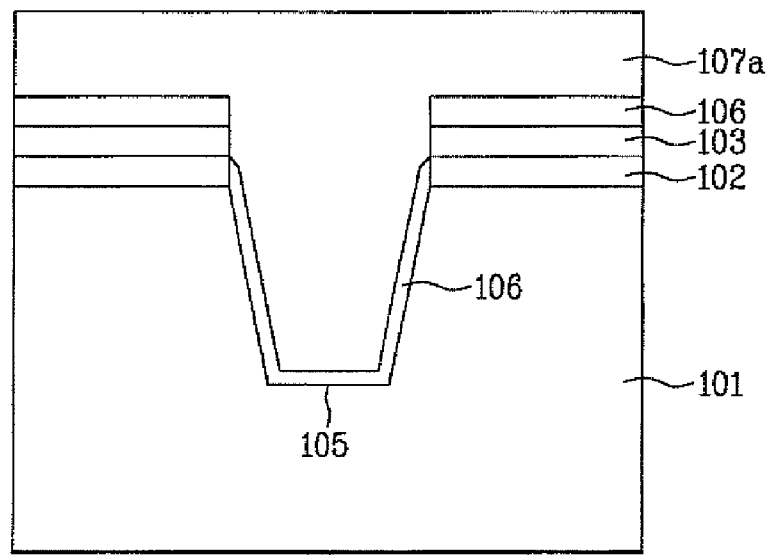
Figure 1C:
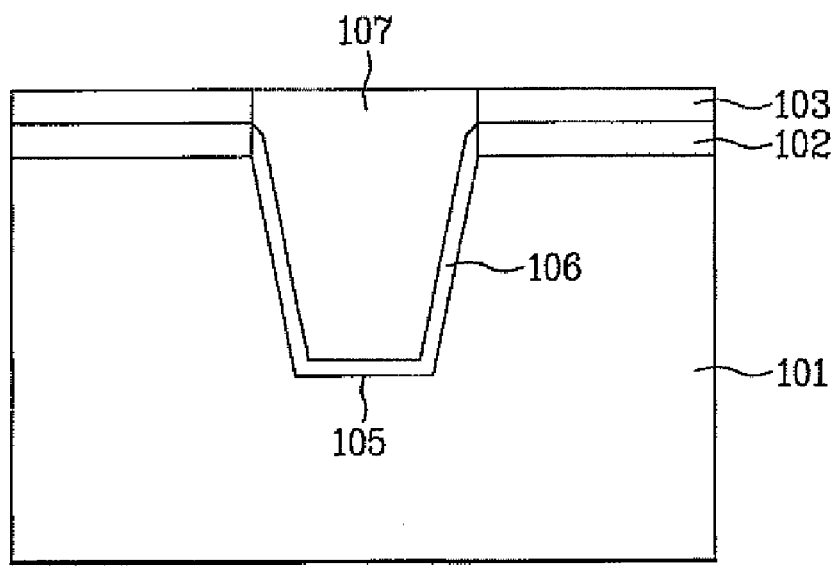
Figure 1D:
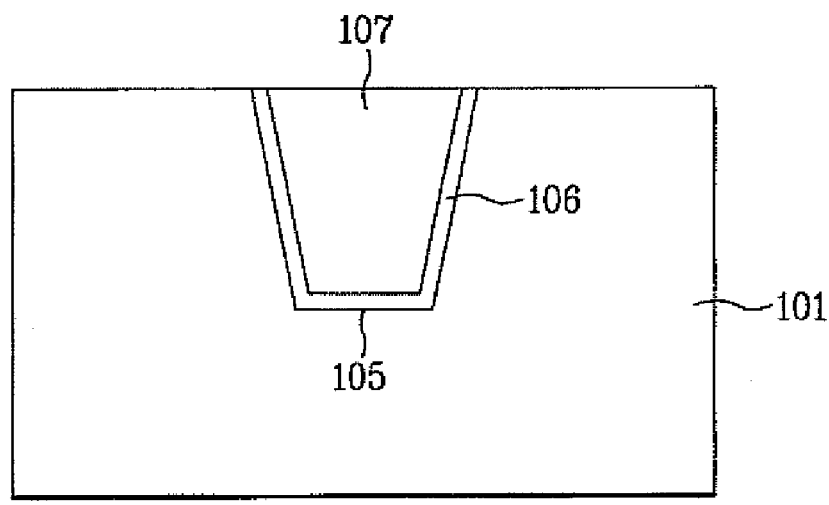
Figure 2:
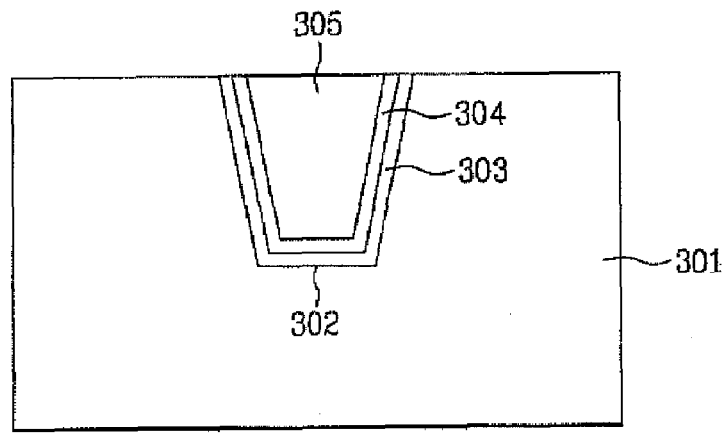
FIG. 2 is a cross-sectional view of an isolation layer structure in accordance with an embodiment of the present invention.

Reference will now be made in detail to the preferred embodiments of the present invention, examples of which are FIG. 2 is a cross sectional view showing an isolation layer structure in accordance with an embodiment of the present invention.

The isolation layer structure for a semiconductor device in accordance with an embodiment of the present invention comprises a trench 302 formed to a predetermined depth in a device isolation area of a semiconductor substrate 301; a thermal oxidation layer 303 formed in a part of the trench 302; an oxidation silicon layer 304 formed on the thermal oxidation layer 303; and an oxidation isolation layer 305 filled in the trench 302 on the oxidation silicon layer 304.

Herein, the oxidation silicon layer 304 comprises SRO (Silicon Rich Oxide). The SRO can be formed by adding oxidation silicon material (SiH4) to a High Density Plasma oxidation layer.

The SRO is a thin film for establishing a stop point for protecting the substrate 301 during a second planarization process using chemical mechanical polishing.

The oxidation isolation layer 305 can be a High Density Plasma oxidation layer for forming the isolation layer of a semiconductor device.

Hereinafter, a method for forming an isolation layer of a semiconductor device according to an embodiment of the present invention will be described with reference to the accompanying drawings.

FIGS. 3a to 3g are cross-sectional views showing a method for forming an isolation layer structure in accordance with an embodiment of the present invention.

Figure 3A:
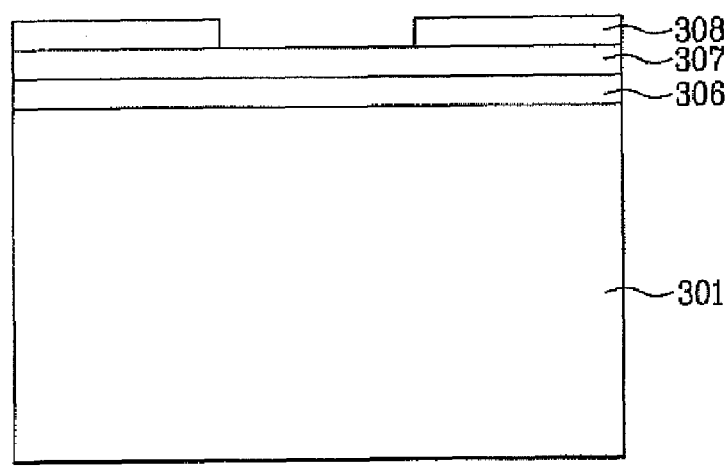
FIGS. 3a to 3g are cross-sectional views showing a method for forming an isolation layer structure in accordance with an embodiment of the present invention.

Referring to FIG. 3a, an oxide layer 306 and a nitride layer 307 can be deposited sequentially on a semiconductor substrate 301.

A photosensitive resist can be coated on the nitride layer 307 and patterned by an exposure and developing process to form photoresist layer pattern 308 exposing the nitride layer 307 on an isolation region of the substrate 301.

Figure 3B:
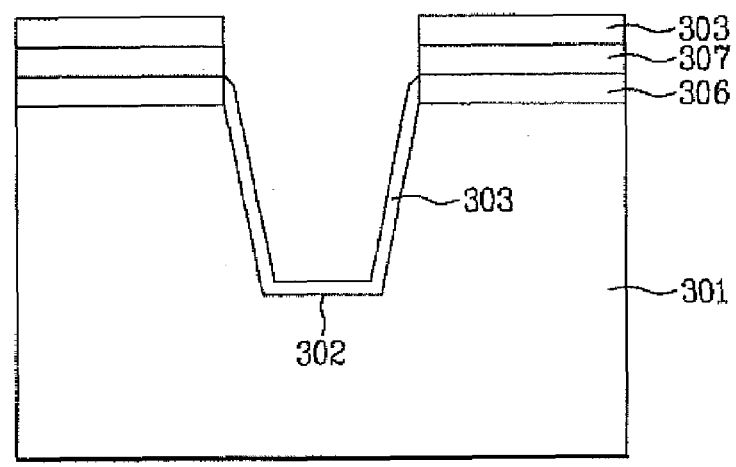

Referring to FIG. 3b, a trench 302 having a predetermined depth can be formed in the substrate 301 by performing an etching process using the photoresist layer pattern 308 as a mask.

The trench 302 is formed by sequentially etching the nitride layer 307, the oxide layer 306, and the semiconductor substrate 301 using the photoresist layer pattern 308 as a mask.

The photoresist layer pattern 308 can be removed through a cleaning process, and a thermal oxidation layer 303 can be formed by a thermal oxidation process. The thermal oxidation layer 303 can protect both sides and lower surface of the semiconductor substrate in the trench 302.

Figure 3C:
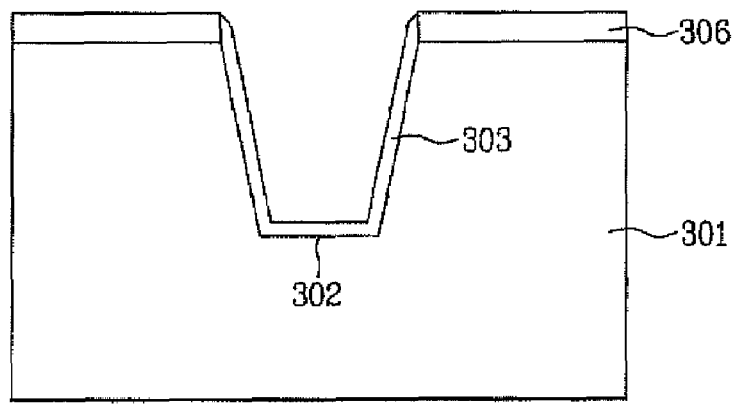

Referring to FIG. 3c, a first planarization process can be performed to a top surface of the semiconductor substrate 301 to remove the thermal oxidation layer 303 and the nitride layer from the top surface of the substrate 301. The first planarization process can be performed until the oxide layer 306 is exposed by using a CMP (Chemical Mechanical Polishing) process. The thermal oxide layer 303 can remain in the trench 302 and on a portion of the sidewalls of the oxide layer 306.

An object of the planarization process is to reduce the depth of the trench such that isolation material deposited in a subsequent process can be filled to the front edge of the trench 302, which can secure a gap fill margin.

Figure 3D:
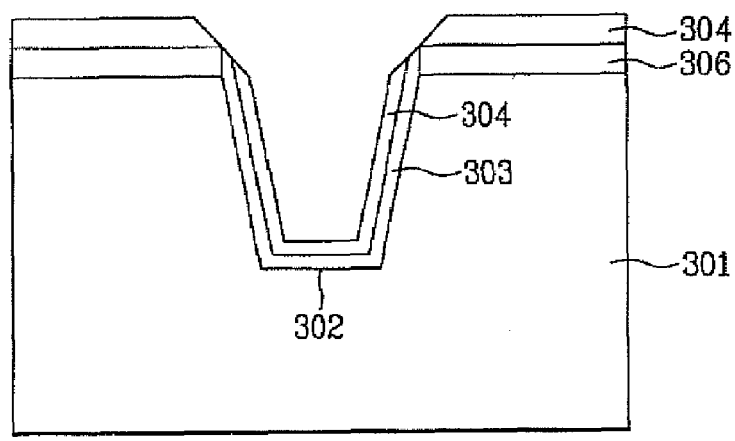

Referring to FIG. 3d, an oxidation silicon layer 304 can be formed on the oxide layer 306 and a part of the trench 302.

In a preferred embodiment, the oxidation silicon layer 304 includes SRO (Silicon Rich Oxide) formed by adding oxidation silicon material (SiH4) to a High Density Plasma oxidation layer.

The role of the oxidation silicon layer 304 is different from the subsequently deposited oxidation isolation layer. That is, the oxidation silicon layer 304 may be used as a stop point for protecting the substrate 301 during a second planarization process using CMP (Chemical Mechanical Polishing).

Figure 3E:
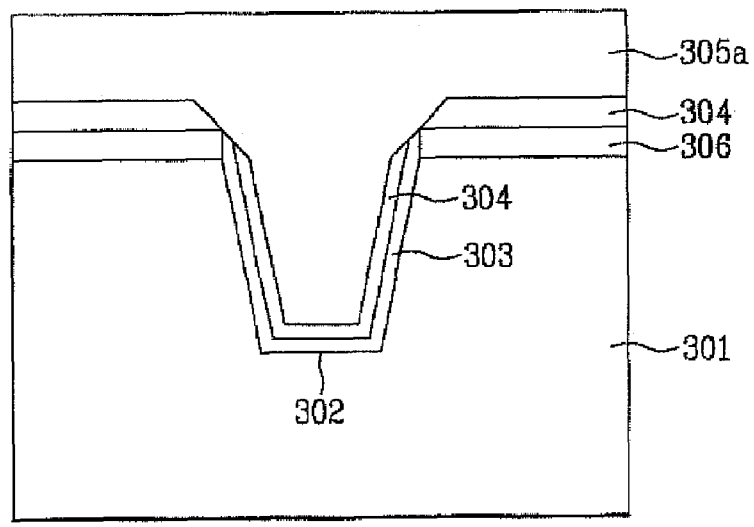

Referring to FIG. 3e, after forming the oxidation silicon layer 304, an oxidation isolation layer 305a can be formed on the semiconductor substrate 301. That is, an oxidation isolation bed 305a can be formed in the trench 302 and on the oxidation silicon layer 304. Thus, the trench 302 can be filled by the oxidation isolation bed 305a. In a preferred embodiment, a High Density Plasma oxide layer can be used as the material for forming oxidation isolation bed 305a.

Figure 3F:
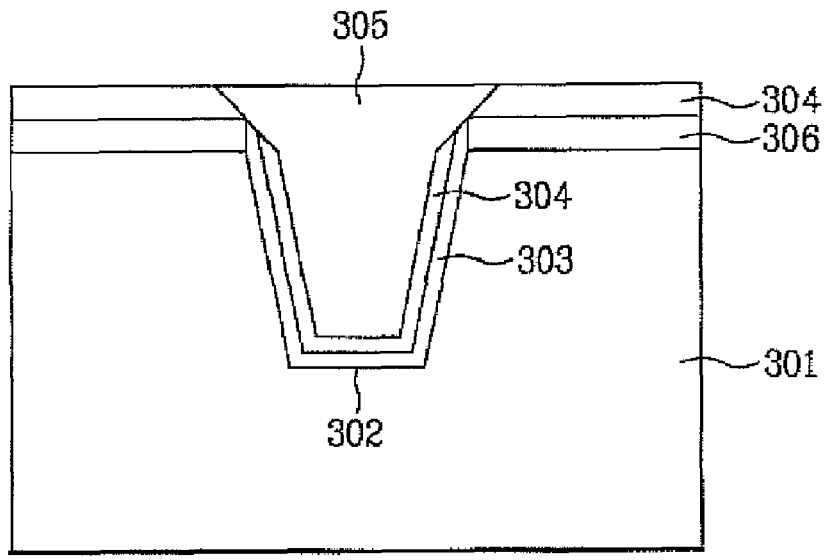

Then, as depicted in FIG. 3f, a second planarization process can be performed until the oxidation silicon layer 304 is exposed on the surface of the semiconductor substrate 301.

The second planarization process can be performed using a CMP (Chemical Mechanical Polishing) process resulting in the oxidation isolation layer 305 formed inside of the trench 302.

Figure 3G:
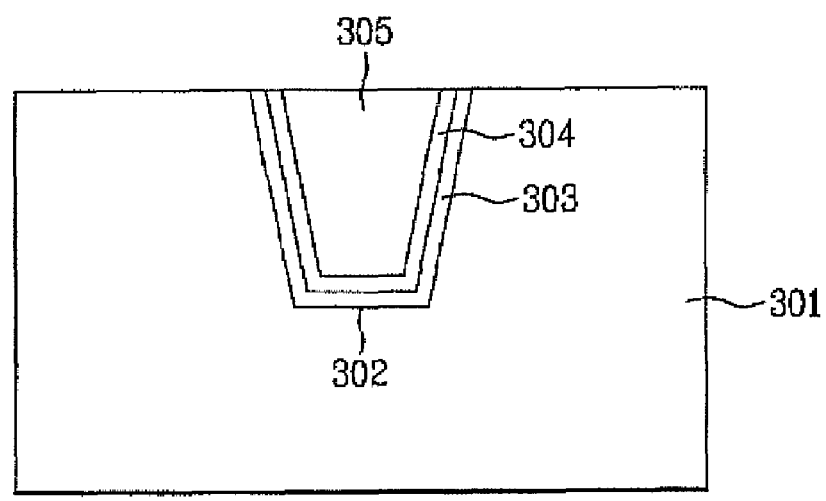

Referring to FIG. 3g, the oxidation silicon layer 304 and the oxide layer 306 can be removed by a wet etching and cleaning process.

Accordingly, a device isolation layer is formed in the device isolation area of a semiconductor device as a trench 302 filled with the oxidation isolation layer 305.

According to a method for forming an isolation layer of a semiconductor device in accordance with an embodiment of the present invention, the isolation layer can be formed by performing a first planarization process to reduce the depth of a trench that needs to be filled.

Therefore, an isolation layer can be filled inside of a trench.

As described above, according to a method for forming an isolation layer in accordance with an embodiment of the present invention, the margin of the isolation layer can be sufficiently secured in a trench even if the depth of the trench formed in a semiconductor substrate is deepened and narrowed. Specifically, gaps in the isolation layer from depositing an isolation oxidation layer in a deep and narrow trench can be prevented.

It will be apparent to those skilled in the art that various modifications and variations can be made in the present invention. Thus, it is intended that the present invention covers the modifications and variations of this invention provided they come within the scope of the appended claims and their equivalents.

I claim:

1. A method for forming an isolation layer for a semiconductor device comprising:
   sequentially forming an oxide layer and a nitride layer on a semiconductor substrate;
   forming a photosensitive film pattern for forming a trench on the nitride layer;
   forming a trench having a predetermined depth using the photosensitive film pattern as an etching mask;
   forming a thermal oxidation layer on the semiconductor substrate, including the trench;
   performing a first planarization process to remove the thermal oxidation layer formed on the nitride layer and to remove the nitride layer until the upper surface of the oxide layer is exposed;

forming an oxidation silicon layer on the semiconductor substrate including the exposed oxide layer and a part of the trench;

forming an oxidation isolation layer on the semiconductor substrate and filling the trench performing a second planarization process to remove a portion of the oxidation isolation layer to expose the oxidation silicon layer; and performing a wet etching process to remove a second portion of the oxidation isolation layer, a portion of the oxidation silicon layer and the oxide layer from a top surface of the semiconductor substrate.

2. The method according to claim 1, wherein the oxidation silicon layer comprises SRO (Silicon Rich Oxide) formed by adding oxidation silicon material (SiH4) to a High Density Plasma oxidation layer.

3. The method according to claim 1, wherein the oxidation isolation layer fills the trench without gaps.

* * * * *